(12) United States Patent
Izumi et al.

(10) Patent No.: US 8,507,965 B2
(45) Date of Patent: Aug. 13, 2013

(54) SEMICONDUCTOR DEVICE AND MANUFACTURING METHOD THEREOF

(75) Inventors: Kazutoshi Izumi, Kawasaki (JP); Hitoshi Saito, Kawasaki (JP); Naoya Sashida, Kawasaki (JP); Kaoru Saigoh, Kawasaki (JP); Kouichi Nagai, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 58 days.

(21) Appl. No.: 12/896,231

(22) Filed: Oct. 1, 2010

(65) Prior Publication Data

US 2011/0012230 A1 Jan. 20, 2011

Related U.S. Application Data

(60) Division of application No. 12/379,488, filed on Feb. 24, 2009, now abandoned, which is a division of application No. 11/133,266, filed on May 20, 2005, now abandoned, which is a continuation of application No. PCT/JP03/05223, filed on Apr. 24, 2003.

(51) Int. Cl.
*H01L 29/76* (2006.01)
*H01L 29/94* (2006.01)
*H01L 31/062* (2012.01)
*H01L 31/113* (2006.01)
*H01L 31/119* (2006.01)

(52) U.S. Cl.
USPC .................... 257/295; 257/760; 257/E21.664

(58) Field of Classification Search
USPC ........................................................ 257/760
See application file for complete search history.

(56) References Cited

U.S. PATENT DOCUMENTS

| | | |
|---|---|---|
| 6,180,503 B1 | 1/2001 | Tzeng et al. |
| 6,287,950 B1 | 9/2001 | Wu et al. |
| 6,348,398 B1 | 2/2002 | Wang |
| 6,448,171 B1 | 9/2002 | Wang et al. |
| 6,455,882 B1 | 9/2002 | Nakura |
| 6,501,112 B1 | 12/2002 | Sashida |
| 6,563,218 B2 | 5/2003 | Matsunaga et al. |
| 6,611,014 B1 | 8/2003 | Kanaya et al. |
| 6,750,138 B2 | 6/2004 | Matsunaga et al. |
| 6,750,492 B2 | 6/2004 | Mikawa et al. |
| 2001/0020708 A1 | 9/2001 | Kasai |

(Continued)

FOREIGN PATENT DOCUMENTS

| | | |
|---|---|---|
| JP | 08-124929 A | 5/1996 |
| JP | 10-247664 A | 9/1998 |

(Continued)

OTHER PUBLICATIONS

Japanese Office Action mailed Sep. 1, 2009, issued in corresponding Japanese Patent Application No. 2004-571089.

(Continued)

*Primary Examiner* — Thien F Tran
(74) *Attorney, Agent, or Firm* — Westerman, Hattori, Daniels & Adrian, LLP (57) ABSTRACT

An insulation film (24) having a gradual inclination of a surface is formed by a high density plasma CVD method, an atmospheric pressure CVD method or the like, after a ferroelectric capacitor (23) is formed. Thereafter, an alumina film (25) is formed on the insulation film (24). According to the method, low coverage of the alumina film (25) does not become a problem, and the ferroelectric capacitor (23) is reliably protected.

5 Claims, 10 Drawing Sheets

(56) References Cited

U.S. PATENT DOCUMENTS

| | | |
|---|---|---|
| 2002/0003305 A1 | 1/2002 | Umakoshi et al. |
| 2002/0020868 A1 | 2/2002 | Yang et al. |
| 2002/0175415 A1 | 11/2002 | Matsunaga |
| 2003/0057557 A1 | 3/2003 | Matsunaga et al. |
| 2003/0201539 A1 | 10/2003 | Matsunaga et al. |

FOREIGN PATENT DOCUMENTS

| | | |
|---|---|---|
| JP | 2001-15696 A | 1/2001 |
| JP | 2001-15703 A | 1/2001 |
| JP | 2001-36026 A | 2/2001 |
| JP | 2002-26286 A | 1/2002 |
| JP | 2002-217198 A | 8/2002 |
| JP | 2003-68987 A | 3/2003 |
| JP | 2003-100757 A | 4/2003 |
| JP | 2003-100994 A | 4/2003 |

OTHER PUBLICATIONS

Chinese Office Action mailed Mar. 13, 2009, issued in corresponding Chinese Application No. 2007101041028.
Chinese Office Action mailed Sep. 5, 2008, issued in corresponding Chinese Patent Application No. 200710104102.8.
Japanese Office Action mailed Feb. 10, 2009, issued in corresponding Japanese Patent Application No. 2004-571089.

SEMICONDUCTOR DEVICE AND MANUFACTURING METHOD THEREOF

CROSS REFERENCE TO RELATED APPLICATION

This application is a divisional of U.S. application Ser. No. 12/379,488 filed on Feb. 24, 2009, which is a divisional of U.S. application Ser. No. 11/133,266 filed on May 20, 2005, which is a continuation of international application PCT/JP03/05223 filed on Apr. 24, 2003, the entire contents of which are incorporated herein by reference.

TECHNICAL FIELD

The present invention relates to a semiconductor device enhanced in endurance against permeation of hydrogen and water from outside and a manufacturing method thereof.

BACKGROUND ART

A wiring rule in a ferroelectric memory (FeRAM) is 0.35 μm recently, and in formation of an interlayer insulation film, a plasma CVD method is mainly adopted.

In order to prevent hydrogen diffusion into a ferroelectric capacitor, an alumina film directly covering the ferroelectric capacitor is formed as a hydrogen diffusion prevention film in a ferroelectric memory.

However, miniaturization is also highly demanded of a ferroelectric memory recently, and with miniaturization, the specifications of the ferroelectric capacitor and wiring become rigid. Meanwhile, coverage of an alumina film is comparatively low. For the above reasons, it cannot be said that protection of the ferroelectric capacitor is sufficient, and deterioration of the ferroelectric capacitor becomes a problem.

Concerning an interlayer insulation film, a gap is sometimes generated in the interlayer insulation film between a ferroelectric capacitor and wiring or the like when a multilayered wiring structure is formed. Therefore, high reliability is difficult to obtain.

Further, high moisture endurance is the characteristic which is required in not only a ferroelectric memory but also most semiconductor devices.

Therefore, in a multilayered wiring structure, the one provided with an SiN film between two wiring layers is also proposed. However, such a structure does not have sufficient moisture resistance.
Patent Document 1
Japanese Patent Application Laid-open No. 2001-36026
Patent Document 2
Japanese Patent Application Laid-open No. 2001-15703

SUMMARY OF THE INVENTION

An object of the present invention is to provide a semiconductor device which can suppress deterioration of a semiconductor element such as a ferroelectric capacitor, and a manufacturing method thereof.

In a first semiconductor device according to the present invention, a semiconductor substrate, a ferroelectric capacitor formed above the semiconductor substrate, and an insulation film directly covering the ferroelectric capacitor and having an inclination of its surface more gradual than an inclination of a surface of the ferroelectric capacitor are provided. A hydrogen diffusion prevention film preventing diffusion of hydrogen to the ferroelectric capacitor is formed on the insulation film.

In a second semiconductor device according to the present invention, a semiconductor substrate, a semiconductor element formed on the semiconductor substrate, a pad formed above the semiconductor substrate and connected to the semiconductor element, and one wiring layer, or two or more wiring layers formed between the semiconductor element and the pad are provided. A water permeation prevention film preventing permeation of water to a lower layer side is formed between an uppermost wiring layer located at an uppermost position of the one wiring layer or two or more wiring layers and the pad.

In a first manufacturing method of a semiconductor device according to the present invention, after a ferroelectric capacitor is formed above a semiconductor substrate, an insulation film directly covering the ferroelectric capacitor and having an inclination of its surface more gradual than an inclination of a surface of the ferroelectric capacitor is formed. A hydrogen diffusion prevention film preventing diffusion of hydrogen to the ferroelectric capacitor is formed on the insulation film.

In a second manufacturing method of a semiconductor device according to the present invention, after a semiconductor element is formed on a semiconductor substrate, one wiring layer, or two or more wiring layers is or are formed above the semiconductor element. Next, a water permeation prevention film preventing permeation of water to a lower layer side is formed above an uppermost wiring layer located at an uppermost position of the one wiring layer or two or more wiring layers. A pad connected to the semiconductor element is formed above the water permeation prevention film.

DETAILED DESCRIPTION OF THE PREFERRED EMBODIMENTS

Hereinafter, embodiments of the present invention will be explained in concrete with reference to the attached drawings.

Figure 1:
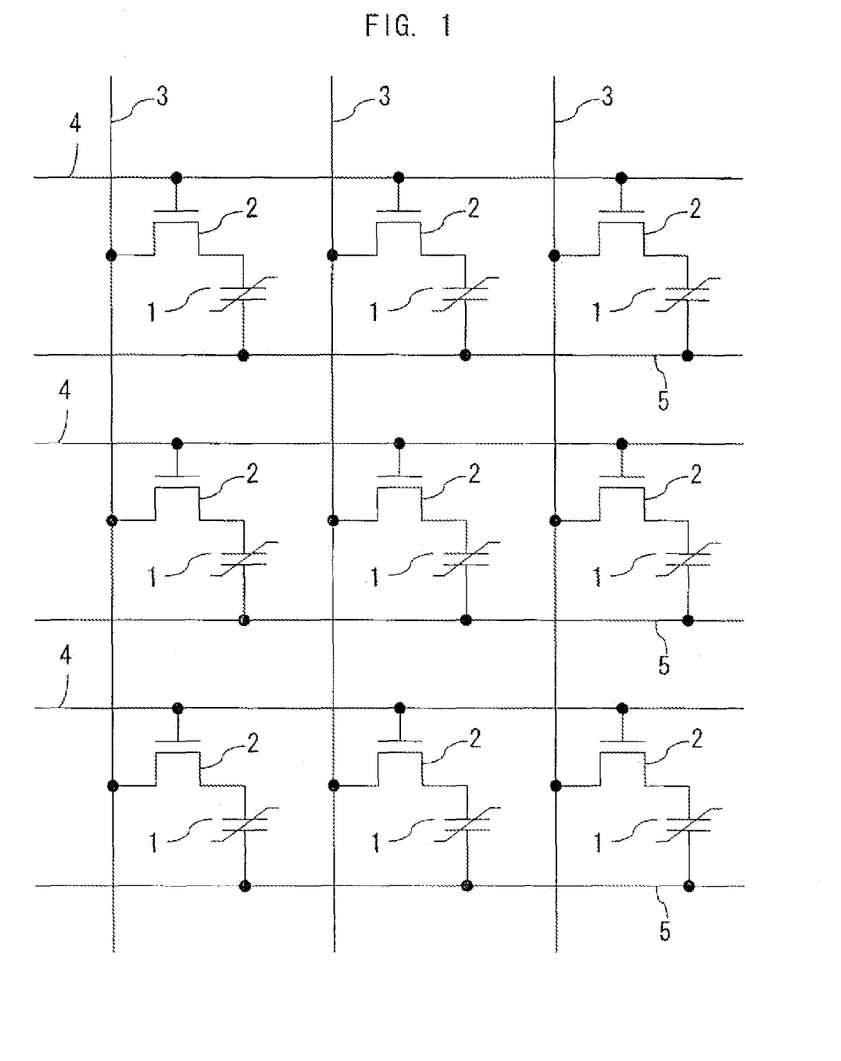
FIG. 1 is a circuit diagram showing a structure of a memory cell array of a ferroelectric memory manufactured according to embodiments of the present invention.

FIG. 1 is a circuit diagram showing a structure of a memory cell array of a ferroelectric memory (semiconductor device) which is manufactured by a method according to the embodiments of the present invention.

This memory cell array is provided with a plurality of bit lines 3 extending in one direction, plurality of word lines 4 and plate lines 5 extending in the perpendicular direction to the direction in which the bit lines 3 extend. A plurality of memory cells of the ferroelectric memory according to the embodiments are disposed in an array form to match a grid constituted by these bit lines 3, word lines 4 and plate lines 5. Each memory cell is provided with a ferroelectric capacitor 1 and a MOS transistor 2.

A gate of the MOS transistor 2 is connected to the word line 4. One source/drain of the MOS transistor 2 is connected to the bit line 3, and the other source/drain is connected to one electrode of the ferroelectric capacitor 1. The other electrode of the ferroelectric capacitor 1 is connected to the plate line 5. Each of the word lines 4 and the plate lines 5 is shared by a plurality of MOS transistors 2 arranged in the same direction as the direction in which they extend. Similarly, each of the bit lines 3 is shared by a plurality of MOS transistors 2 arranged in the same direction as the direction in which it extends. The direction in which the word line 4 and the plate line 5 extend is sometimes called the row direction, and the direction in which the bit line 3 extends is sometimes called the column line.

In the memory cell array of the ferroelectric memory thus constituted, data is stored in accordance with the polarization state of the ferroelectric film provided on the ferroelectric capacitor 1.

First Embodiment

Figure 2A:
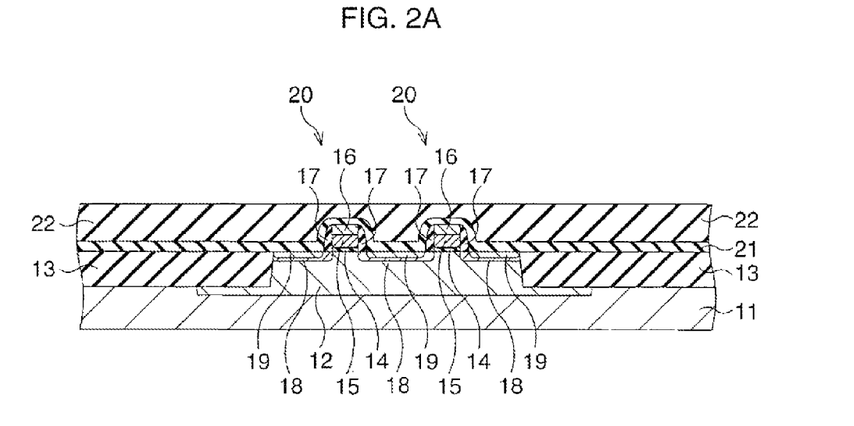
FIGS. 2A to 2G are sectional views of a manufacturing method of a ferroelectric memory according to a first embodiment of the present invention in sequence of process steps.

Next, a first embodiment of the present invention will be explained. Here, a structure of each memory cell is explained with its manufacturing method for convenience. FIGS. 2A to 2G are sectional views which show a manufacturing method of a ferroelectric memory (semiconductor device) according to the first embodiment of the present invention in sequence of process steps. In FIGS. 2A o 2G, the part corresponding to two MOS transistors sharing one bit line (corresponding to the bit line 3 in FIG. 1) is shown.

In the first embodiment, a well 12 is formed on a surface of a semiconductor substrate 11 of the silicon substrate or the like first as shown in FIG. 2A. Next, an element isolation region 13 is formed on the surface of the semiconductor substrate 11 by STI (Shallow Trench Isolation), for example. Subsequently, gate insulation films 14, gate electrodes 15, cap films 16, side walls 17, source/drain diffusion layers 18 and silicide layers 19 are formed on the surface of the well 12, and thereby, MOS transistors 2 are formed as switching elements. The MOS transistor 20 corresponds to the MOS transistor 2 in FIG. 1. Two source/drain diffusion layers 18 are formed for source and drain in each of the MOS transistors 20, and one of them is shared by two MOS transistors 20.

Next, a silicon oxynitride film 21 is formed on the entire surface to cover the MOS transistor 20, and an $SiO_2$ film 22 is further formed on the entire surface as an interlayer insulation film, and the $SiO_2$ film 22 is flattened by CMP (Chemical Mechanical Polishing) or the like. The silicon oxynitride film 21 is formed to prevent water deterioration of the gate insulation film 14 or the like on forming the $SiO_2$ film 22.

Figure 2B:
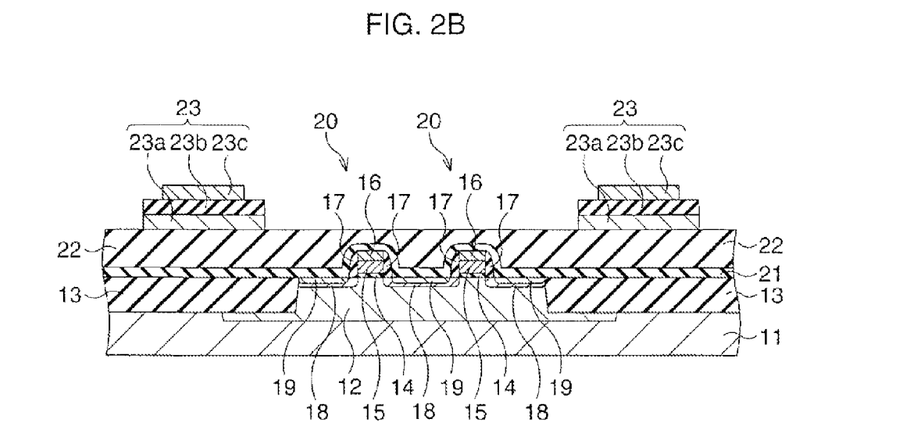

Thereafter, as shown in FIG. 2B, a ferroelectric capacitor 23 of a planar structure is formed on the $SiO_2$ film 22. The ferroelectric capacitor 23 is composed of a bottom electrode 23a, a ferroelectric film 23b and a top electrode 23c which are layered in sequence. The ferroelectric capacitor 23 corresponds to the ferroelectric capacitor 1 in FIG. 1.

Figure 2C:
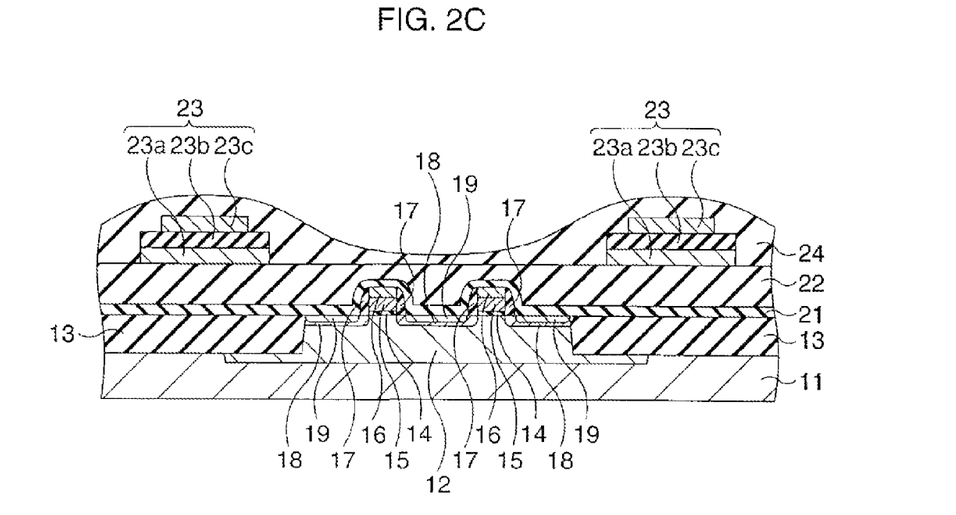

Subsequently, as shown in FIG. 2C, an insulation film 24 having an inclination of its surface more gradual than the inclination of the surface of the ferroelectric capacitor 23 is formed. As the insulation film 24, an $SiO_2$ film doped with no impurity (NSG (Non-doped Silicate Glass) film), an $SiO_2$ film doped with P (PSG (Phospho-Silicate Glass) film), an $SiO_2$ film doped with B and P (BPSG (Boron Phospho-Silicate Glass) film), an $SiO_2$ film doped with F (FSG (Fluoro-Silicate Glass) film) and the like may be formed, by an atmospheric-pressure CVD method with TEOS (Tetra-Ethyl Ortho-Silicate) and $O_3$ being used, for example. As the insulation film 24, an NSG film, a PSG film, a BPSG film, an FSG film, SiON film and the like may be formed by a high density plasma (HDP: High Density Plasma) CVD method, for example. Further, as the insulation film 24, an $SiO_2$ film, SiON film and the like may be formed by a plasma CVD method.

It should be noted that, when the insulation film 24 is formed by the atmospheric pressure CVD method or the plasma CVD method, it is preferable to reduce water in the insulation film 24 and improve the film quality of the insulation film 24 by performing plasma treatment using plasma of $N_2$ or $N_2O$ for the insulation film 24. It is preferable to set the treatment temperature at this time at 200° C. to 450° C.

When the insulation film 24 is formed by the atmospheric pressure CVD method, it is preferable to form an $SiO_2$ film or an SiON film of about 300 Å to 1000 Å by a plasma CVD method. This is for enhancement of coverage and prevention of permeation of water into the ferroelectric capacitor 23.

Further, it is preferable to set the temperature of the semiconductor substrate 11 at the time of film forming at 175° C. to 350° C. This is because there is a possibility that the coverage becomes low if the temperature is lower than 175° C. and there is a possibility that the ferroelectric capacitor 23 already formed is broken if the temperature exceeds 350° C.

Figure 2D:
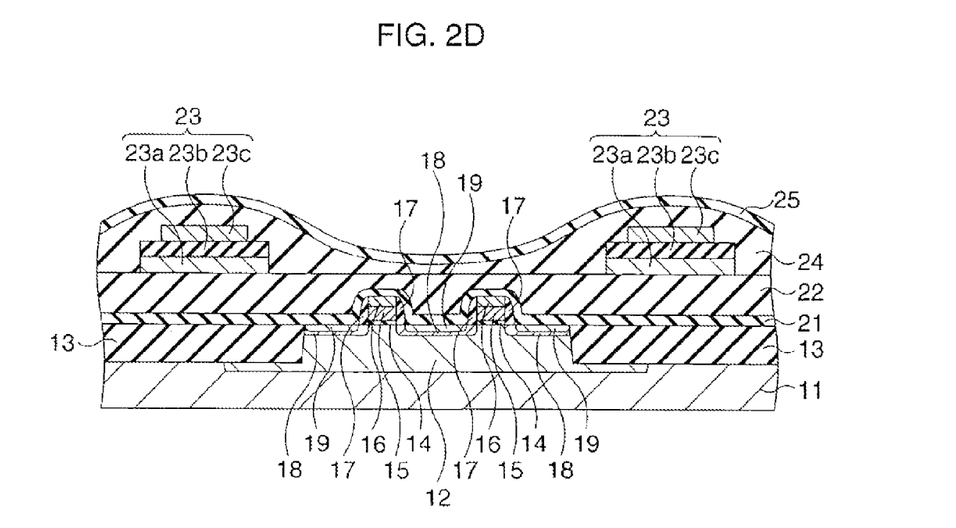

Next, as shown in FIG. 2D, an alumina film (aluminum oxide film) 25 is formed on the insulation film 24 as a hydrogen diffusion prevention film. Since steep portions exist on side surfaces or the like of the ferroelectric capacitor 23, insufficient coverage occurs when the alumina film is formed to directly cover the ferroelectric capacitor 23, but in this embodiment, low coverage of the alumina film 25 does not matter, because the insulation film 24 is formed and the inclination of its surface is gradual.

Figure 2E:
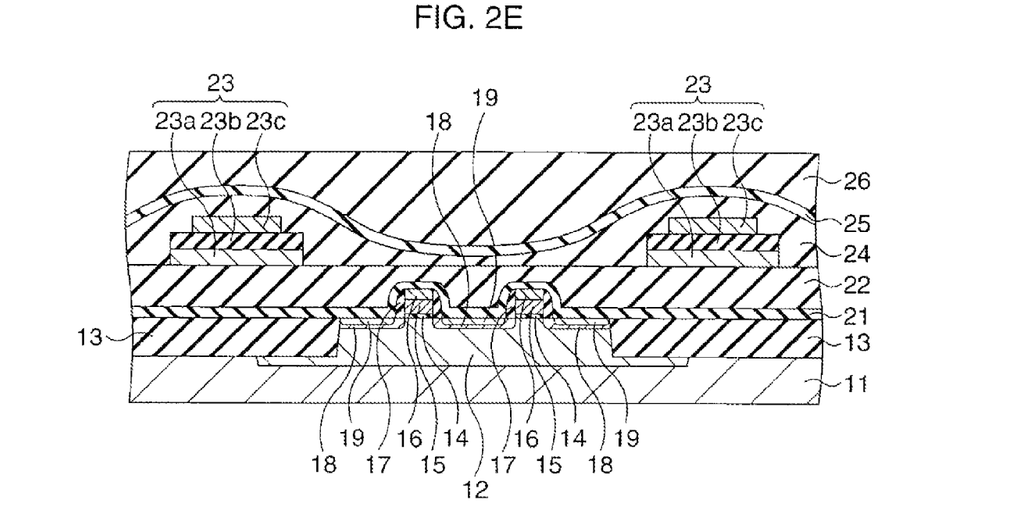

Next, as shown in FIG. 2E, an Si oxide film 26 is formed on the entire surface as an interlayer insulation film, and flattening of the Si oxide film 26 is performed by CMP or the like.

Figure 2F:
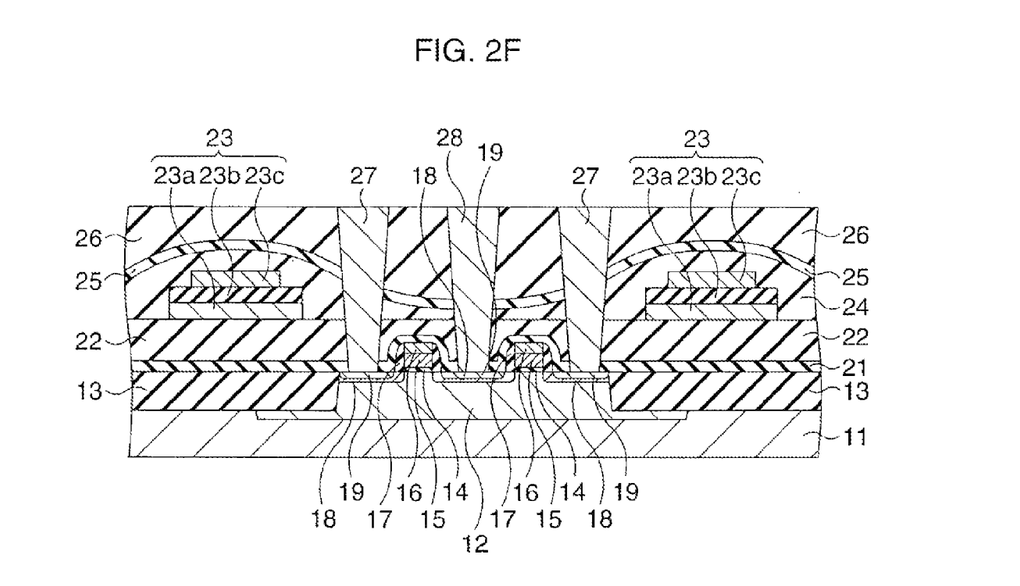

Thereafter, as shown in FIG. 2F, a contact hole which reaches each of the silicide layers 19 is formed in the Si oxide film 26, the alumina film 25, the insulation film 24, the $SiO_2$ film 22 and the silicon oxynitride film 21, and thereby, a plug contact part is opened, with patterning and etching techniques used. Subsequently, a barrier metal film (not shown) is formed in each contact hole, and a W film is buried in an inside thereof by a CVD method, for example, and the W film is flattened by performing CMP, whereby W plugs 27 and 28 are formed. The W plug 28 is one connected to the silicide layer 19 shared by the two MOS transistors 20, and the W plug 27 is another one connected to the remaining silicide layer 19.

Figure 2G:
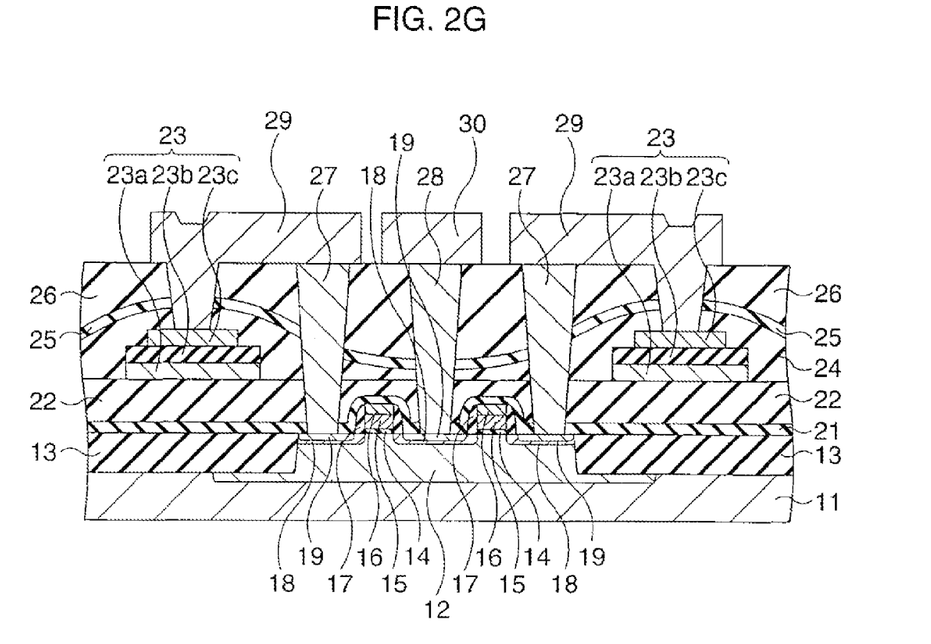

Next, as shown in FIG. 2G, contact holes which reach the top electrodes 23c are formed in the Si oxynitride film 26, the alumina film 25 and the insulation film 24, with patterning and etching techniques used. Subsequently, wirings 29 which connect the top electrodes 23c and the W plugs 27 via the contact holes and a wiring 30 which is connected to the W plug 28 is formed, on the Si oxide film 26.

It is preferable to perform annealing at 400° C. to 600° C. for the ferroelectric capacitor 23 in oxygen atmosphere, nitrogen atmosphere, or the atmosphere of the mixture gas of them, before formation of the wirings 29 and 30. By performing such annealing, the characteristic of the ferroelectric capacitor 23 which is deteriorated in the process steps so far is recovered.

Thereafter, formation of interlayer insulation films, formation of contact plugs, formation of wirings from the second layer onward and the like are performed. Subsequently, a passivation film composed of a silicon oxide film and an Si$_3$N$_4$ film, for example, is formed, and thereby, a ferroelectric memory having a ferroelectric capacitor is completed. On forming the upper wiring, a wiring (not shown) connected to the bottom electrode 23a is connected to the plate line (corresponding to the plate line 5 in FIG. 1), and the wiring 29 is connected to the bit line (corresponding to the bit line 3 in FIG. 1). As for the gate electrode 15, the gate electrode 15 itself may be made the word line, and the gate electrode 15 may be connected to the word line in the upper wiring.

According to the first embodiment, coverage of the alumina film 25 does not become a problem, and therefore, permeation of hydrogen into the ferroelectric capacitor 23 can be reliably prevented. Namely, it becomes possible to reliably protect the ferroelectric capacitor 23.

Especially when a silicon oxynitride film is formed by a high density plasma CVD method as the insulation film 24, this insulation film 24 also functions as the water permeation prevention film, and therefore, the ferroelectric capacitor 23 can be protected more firmly.

It is preferable that the thickness of the hydrogen diffusion preventing film is 10 nm to 100 nm. This is because if the thickness is less than 10 nm, there is a possibility that diffusion of hydrogen cannot be prevented sufficiently, and if the thickness exceeds 100 nm, etching of the hydrogen diffusion preventing film becomes difficult.

As a hydrogen diffusion preventing film, an Al oxynitride film, a Ta oxide film, a Ti oxide film and the like may be formed other than the alumina film.

Second Embodiment

Next, a second embodiment of the present invention will be explained. Here, a structure of a semiconductor device will be explained with its manufacturing method for convenience. FIGS. 3A to 3E are sectional views showing a manufacturing method of a ferroelectric memory (semiconductor device) according to the second embodiment of the present invention in sequence of the process steps.

Figure 3A:
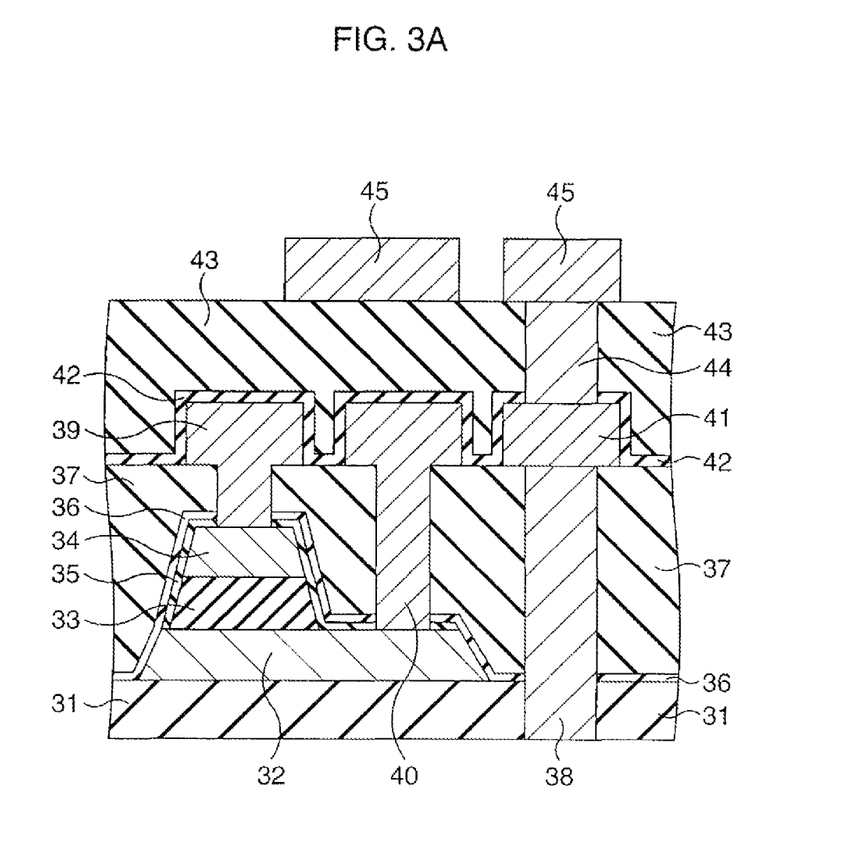
FIGS. 3A to 3E are sectional views showing a manufacturing method of a ferroelectric memory according to a second embodiment of the present invention in sequence of process steps.

In the second embodiment, after a semiconductor element (not shown) and the like are formed on a semiconductor substrate (not shown) as in the first embodiment, an interlayer insulation film 31 is formed above the semiconductor substrate as shown in FIG. 3A.

Next, a raw material film of a bottom electrode (bottom electrode film), a ferroelectric film and a raw material film of a top electrode (top electrode film) are sequentially deposited on the interlayer insulation film 31, and by patterning the top electrode film and the ferroelectric film, a top electrode 34 and a ferroelectric capacity insulation film 33 are formed. Next, an alumina film 35 is formed on an entire surface, and the alumina film 35 and the bottom electrode film are patterned, whereby a bottom electrode 32 is formed. Subsequently, an alumina film 36 is formed on the entire surface. The thickness of the alumina films 35 and 36 are, for example, about 50 nm and 20 nm respectively.

Thereafter, an interlayer insulation film 37 is formed on the entire surface, and a contact hole is formed in the interlayer insulation film 37, the alumina film 36 and the interlayer insulation film 31, and a W plug 38 is buried in the contact hole. Further, contact holes which respectively reach the top electrode 34 and the bottom electrode 32 are formed in the interlayer insulation film 37, the alumina film 36 and the alumina film 35. Then, an Al wiring 39 connected to the top electrode 34, an Al wiring 40 connected to the bottom electrode 32, and an Al wiring 41 connected to the W plug 38 are formed on the interlayer insulation film 37. Subsequently, an alumina film 42 of the thickness of about 20 nm is formed on the entire surface, and an interlayer insulation film 43 is formed thereon.

Next, a contact hole which reaches the Al wiring 41 and the like is formed in the interlayer insulation film 43 and the alumina film 42, and a W plug 44 is buried in this contact hole. Next, an Al wiring 45 is formed on the interlayer insulation film 43.

Figure 3B:
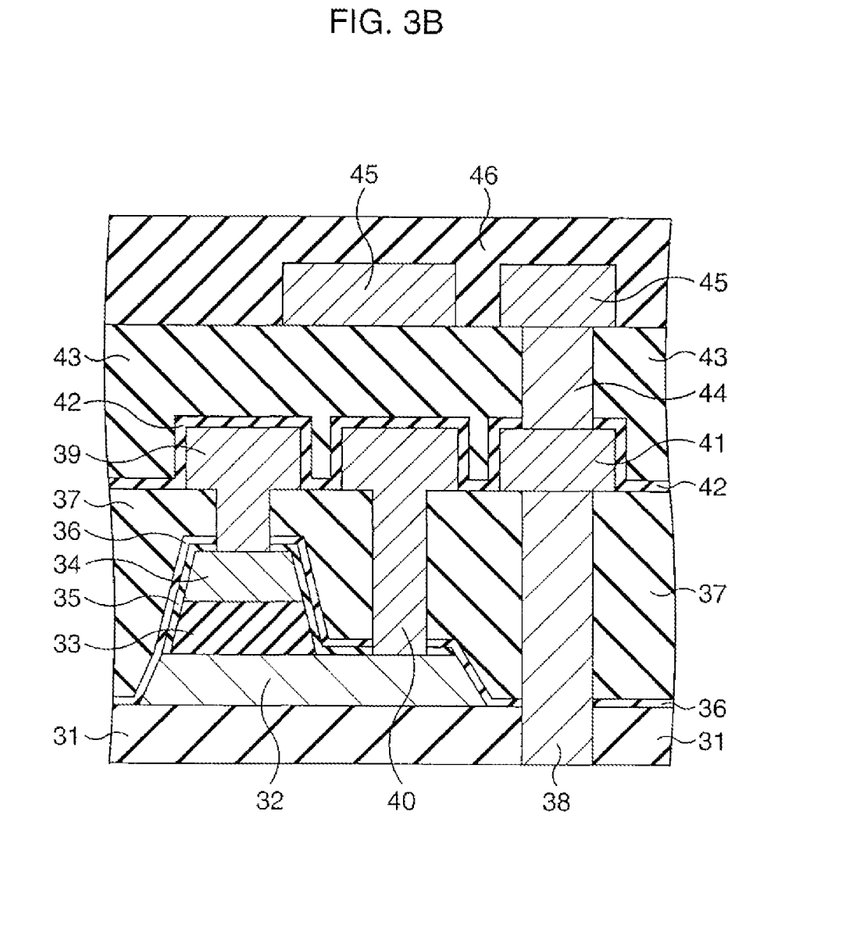

Thereafter, as shown in FIG. 3B, an SiO$_2$ film 46 of the thickness of about 2.2 μm is formed by a plasma CVD method with TEOS as a raw material. Subsequently, the SiO$_2$ film 46 is flattened by being polished until it has the thickness of about 1.0 μm by CMP. Thereafter, plasma treatment using N$_2$O is performed for the SiO$_2$ film 46, and thereby, water existing in the SiO$_2$ film 46 is reduced.

Figure 3C:
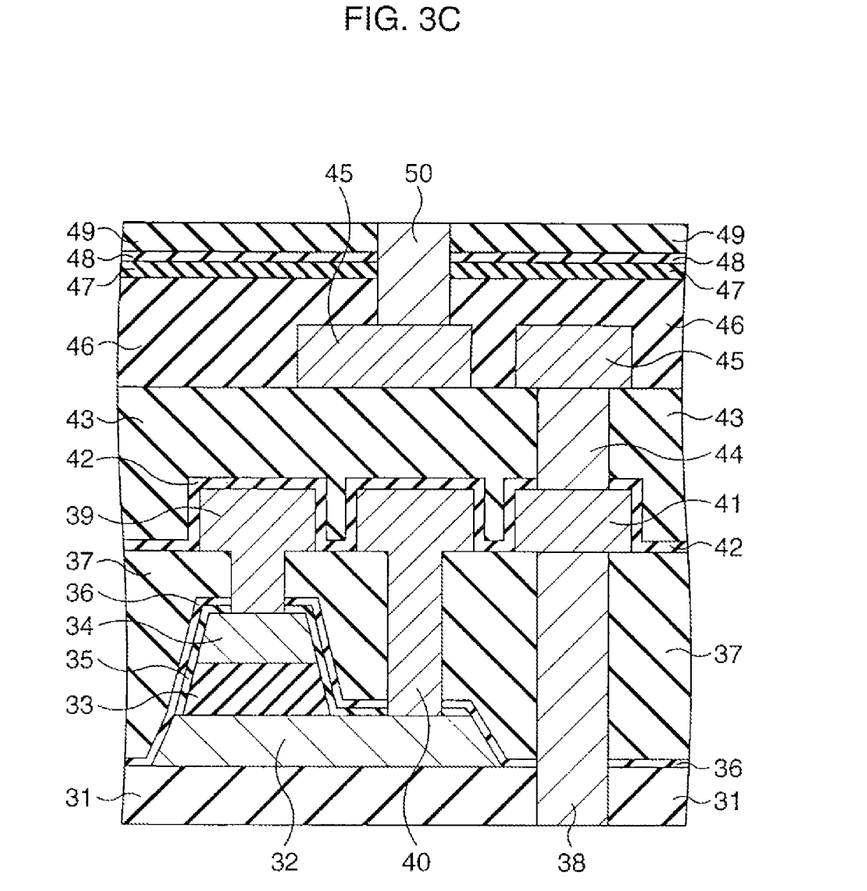

Subsequently, as shown in FIG. 3C, an SiO$_2$ film 47 of the thickness of about 100 nm is formed on the entire surface by a plasma CVD method with TEOS as a raw material. Then, plasma treatment using N$_2$O is performed for the SiO$_2$ film 47, and thereby, water existing in the SiO$_2$ film 47 is reduced. Next, an alumina film 48 is formed on the SiO$_2$ film 47 as a water permeation prevention film, and an SiO$_2$ film 49 of the thickness of about 100 nm is formed on the alumina film 48 with TEOS as a raw material by a plasma CVD method. Then, plasma treatment using N$_2$O is performed for the SiO$_2$ film 49, and thereby, water existing in the SiO$_2$ film 49 is reduced. Then, a contact hole which reaches the Al wiring 45 is formed, and a W plug 50 is buried in this contact hole. The thickness of the alumina film 48 is about 50 nm, for example.

When the SiO$_2$ film 46 is formed by an HDP (High Density Plasma) CVD method, and a void (pore) does not occur in the SiO$_2$ film 46, after N$_2$O plasma treatment is performed as necessary after flattening by CMP, and the alumina film 48 may be directly formed on the SiO$_2$ film 46 without forming the SiO$_2$ film 47.

Figure 3D:
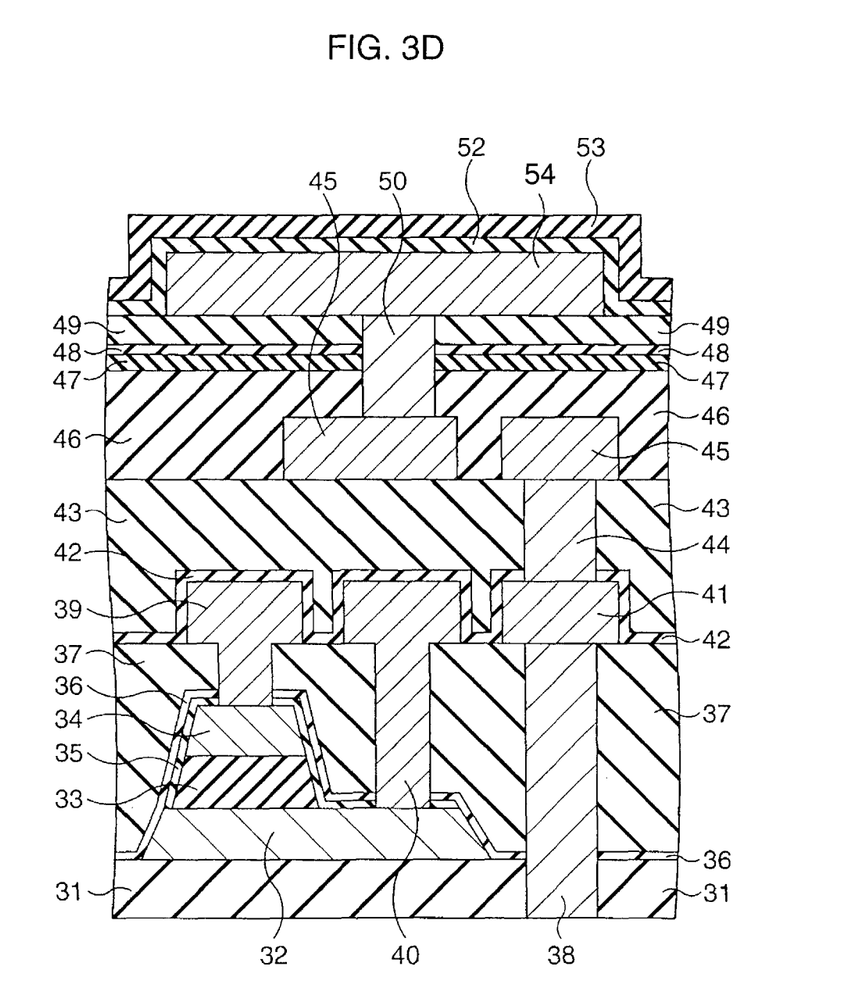
Figure 3E:
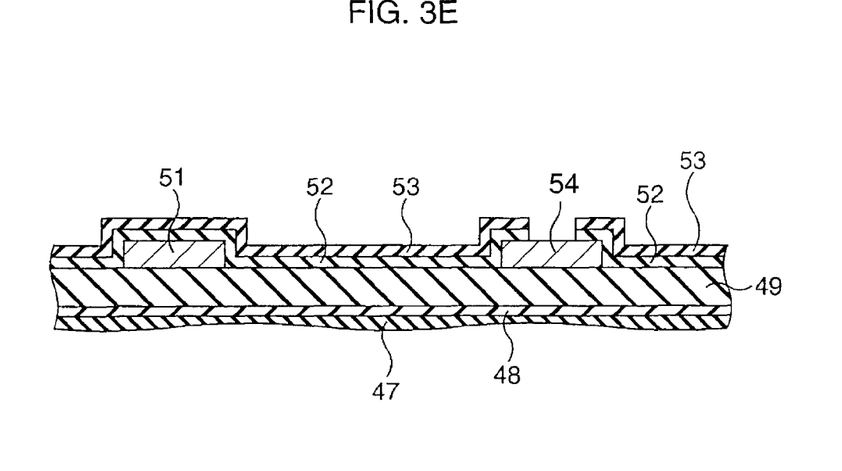

Next, as shown in FIG. 3D, an Al wiring 51 is formed on the SiO$_2$ film 49. At this time, as shown in FIG. 3E, a pad 54 for wire-bonding is formed at the same layer as the Al wiring 51. Namely, an Al film is formed on the SiO$_2$ film 49, and by patterning this, the Al wiring 51 and the pad 54 are formed from the same Al film.

Thereafter, as shown in FIGS. 3D and 3E, a high density plasma SiO$_2$ film 52 and Si$_3$N$_4$ film 53 are sequentially formed on the entire surface as a passivation film. Then, an opening for exposing a part of the pad 54 is formed in the high density plasma SiO$_2$ film 52 and Si$_3$N$_4$ film 53.

According to the second embodiment, permeation of water into the semiconductor element (ferroelectric capacitor and the like) can be prevented more reliably. Namely, when a water permeation prevention film is formed to cover the ferroelectric capacitor, wiring and the like, there is a possibility that water permeates onto the water permeation prevention film and water concentrates thereon and thereafter, the water permeates into the semiconductor element, but if the water permeation prevention film (alumina film 48) is formed between the pad 54 and the wiring layer on the uppermost layer as in this embodiment, water hardly reaches the semiconductor element, and therefore, water permeation can be prevented more reliably.

The alumina film 48 used as the water permeation prevention film in the second embodiment also has a function of preventing diffusion of hydrogen. Therefore, it is also possible to suppress deterioration of the ferroelectric capacitor by hydrogen. Accordingly, it is preferable to use the water permeation prevention film which not only can prevent permeation of water but also can prevent diffusion of hydrogen, as the water permeation prevention film.

Here, the result of the moisture resistance test which the inventors of the present application actually made will be explained. In this moisture resistance test, the produced semiconductor devices were placed under the conditions of the predetermined temperature and humidity, and it was examined whether the semiconductor devices normally operated 72 hours later, 168 hours later and 336 hours later. The results are shown in Table 1 to Table 3. In example 1, the alumina film was formed as the water permeation prevention film between the uppermost wiring layer (wiring layer located at the uppermost position) and the pad as in the second embodiment. On the other hand, in the comparative example 2, such an alumina film as in example 1 was not formed. The denominators of "the number of failures" in Table 1 to Table 3 are the total numbers of specimens used in measurement, and the numerators are the total numbers of the specimens which were determined as fail because they did not operate normally. As shown in Table 1 to Table 3, example 1 according to the second embodiment was extremely excellent in moisture resistance for a long period of time.

After an insulation film is formed by a high density plasma CVD method so as to cover a wiring layer on the uppermost layer, a water permeation prevention film may be formed thereon.

It is preferable that the thickness of a water permeation prevention film is 10 nm to 100 nm. This is because if the thickness is less than 10 nm, permeation of water cannot be sufficiently prevented, and if the thickness exceeds 100 nm, it becomes difficult to etch the water permeation prevention film.

Further, as a water permeation prevention film, a silicon nitride film, a silicon oxynitride film, a tantalum oxide film, a titanium oxide film and the like may be formed other than an alumina film.

A pad is not limited to the use for wire-bonding, and a bump may be formed on, for example, the pad.

In any of the first and the second embodiments, a forming method of the alumina film is not specially limited. For example, the alumina film may be formed by a physical vapor deposition method, or an MOCVD method, or the alumina film may be formed with hydrolysis expressed by the following chemical formula.

—Chemical Formula—

$$2AlCl_3 + 3H_2O \rightarrow Al_2O_3 + 6HCl\uparrow$$

In formation of a passivation film, it is preferable to form a silicon oxide film under an $Si_3N_4$ film by a high density plasma CVD method, or it is preferable to form two silicon oxide films by a high density plasma CVD method, to form a hydrogen diffusion prevention film therebetween and to form an $Si_3N_4$ film on the upper silicon oxide film. A TEOS oxide film may be used as the silicon oxide film under the $Si_3N_4$ film.

Further, a wiring material is not limited to Al. For example, Cu wiring or Al—Cu alloy wiring may be used. In formation of the contact plug, it is preferable to form a barrier metal film composed of a TiN film and a Ti film sequentially formed, or a barrier metal film composed of only a TiN film in a contact hole before the W plug is buried.

As a capacity insulation film (ferroelectric film) of a ferroelectric capacitor, for example, a PZT (Pb (Zr,Ti) $O_3$) film, a SBT ($SrBi_2Ta_2O_9$) film, or the like can be used. The methods for forming these films are not specially limited, and, they can be formed by, for example, an MOCVD method.

Both effects can be obtained by applying the first embodiment and the second embodiment at the same time.

INDUSTRIAL APPLICABILITY

As explained in detail thus far, according to the present invention, permeation of hydrogen or water can be prevented more reliably by the hydrogen diffusion prevention film or the water permeation prevention film. Therefore, reliability is enhanced, and yield and productivity are increased.

TABLE 1

| | 72 HOURS LATER | |
|---|---|---|
| | NUMBER OF FAILURES | FAILURE RATE (%) |
| EXAMPLE 1 | 0/20 | 0.0 |
| COMPARATIVE EXAMPLE 2 | 0/20 | 0.0 |

TABLE 2

| | 168 HOURS LATER | |
|---|---|---|
| | NUMBER OF FAILURES | FAILURE RATE (%) |
| EXAMPLE 1 | 0/20 | 0.0 |
| COMPARATIVE EXAMPLE 2 | 0/20 | 0.0 |

TABLE 3

| | 336 HOURS LATER | |
|---|---|---|
| | NUMBER OF FAILURES | FAILURE RATE (%) |
| EXAMPLE 1 | 0/20 | 0.0 |
| COMPARATIVE EXAMPLE 2 | 8/20 | 40.0 |

What is claimed is:

1. A semiconductor device, comprising:
a semiconductor substrate;
a semiconductor element formed on the semiconductor substrate;
a pad formed above the semiconductor substrate and connected to the semiconductor element;
one wiring layer or two or more wiring layers formed between the semiconductor element and the pad;
a water permeation prevention film formed between the pad and an uppermost wiring layer located at an uppermost position of the one wiring layer or two or more wiring layers, and preventing permeation of water from the pad side to the uppermost wiring layer side; and
an alumina film that is away from the water permeation prevention film and covers a part of the wiring layer or the wiring layers.

2. The semiconductor device according to claim 1, further comprising an insulation film formed to cover the uppermost wiring layer by a high density plasma CVD method.

3. The semiconductor device according to claim 1, wherein the water permeation prevention film is one selected from a group consisting of an aluminum oxide film, a silicon nitride film and a silicon oxynitride film.

4. The semiconductor device according to claim 1, wherein thickness of the water permeation prevention film is 10 nm to 100 nm.

5. The semiconductor device according to claim 1, further comprising a ferroelectric capacitor formed at any layer between the semiconductor substrate and the uppermost wiring layer.

* * * * *